United States Patent
Opitz et al.

(10) Patent No.: US 6,177,840 B1
(45) Date of Patent: Jan. 23, 2001

(54) CIRCUIT ARRANGEMENT FOR AMPLIFYING A DIFFERENTIAL VOLTAGE SIGNAL WHICH HAS A SUBSTANTIALLY TEMPERATURE INDEPENDENT CHARACTERISTIC CURVE

(75) Inventors: Bernhard Opitz; Oliver Schatz, both of Reutlingen (DE)

(73) Assignee: Robert Bosch GmbH, Stuttgart (DE)

( * ) Notice: Under 35 U.S.C. 154(b), the term of this patent shall be extended for 0 days.

(21) Appl. No.: 09/251,613

(22) Filed: Feb. 17, 1999

(30) Foreign Application Priority Data

Feb. 17, 1998 (DE) .............................. 198 06 394

(51) Int. Cl.⁷ ........................................... H03F 3/45
(52) U.S. Cl. ........................ 330/256; 330/289; 330/146
(58) Field of Search .................... 330/146, 252, 330/256, 289

(56) References Cited

U.S. PATENT DOCUMENTS

| | | | |
|---|---|---|---|
| 3,528,022 | * 9/1970 | Adams | 330/256 |
| 4,929,907 | * 5/1990 | Berkel | 330/252 |
| 5,404,058 | * 4/1995 | Nishijima | 330/256 |
| 5,471,654 | * 11/1995 | Okazaki et al. | 330/256 |
| 5,900,782 | * 5/1999 | Igarashi et al. | 330/256 |

* cited by examiner

Primary Examiner—Michael B Shingleton
(74) Attorney, Agent, or Firm—Kenyon & Kenyon

(57) ABSTRACT

A circuit arrangement for amplifying a differential voltage signal in an output signal proportional to a voltage difference is provided, the voltages of a signal source that are to be compared being present at two inputs of the circuit arrangement, and a current signal proportional to the voltage difference being present at one output of the circuit arrangement, the circuit arrangement comprising cross-coupled transistors and the inputs being respectively connected to the base of one of the transistors, and a cross current of the circuit arrangement being present at the output. A compensation circuit is provided having a temperature behavior which corresponds to the temperature behavior of cross resistances of the circuit arrangement, the compensation circuit being associated with each of the inputs of the circuit arrangement.

5 Claims, 2 Drawing Sheets

CIRCUIT ARRANGEMENT FOR AMPLIFYING A DIFFERENTIAL VOLTAGE SIGNAL WHICH HAS A SUBSTANTIALLY TEMPERATURE INDEPENDENT CHARACTERISTIC CURVE

FIELD OF THE INVENTION

The present invention relates to a circuit arrangement for amplifying a differential voltage signal in an output signal proportional to a voltage difference.

BACKGROUND INFORMATION

Circuit arrangements for amplifying a differential voltage signal in an output signal proportional to a voltage difference are known. In these conventional circuits, the voltages to be compared are applied to two inputs of the circuit arrangement, and a current signal proportional to a resulting voltage difference is generated at an output of the circuit arrangement. Cross-coupled circuits of transistors are usually used, the inputs of the circuit arrangements being respectively connected to the base of one of the transistors. If a voltage difference exists at the two inputs, a cross current proportional to the voltage difference is generated. That current can be picked off at an output of the circuit arrangement, and can be converted into a voltage by connecting the output to a resistive load. Circuit arrangements of this kind are suitable, for example, for the analysis of sensor signals with which at least one physical and/or chemical measured value can be analyzed. Because of the cross-coupled connection of the transistors, it is possible to achieve amplification of the differential signal with high linearity in terms of temperature when using transistors which exhibit high current gain. When such circuit arrangements are used in integrated circuits, however, the transistors of the cross-coupled circuit generally possess a relatively low current gain, which results in a nonlinearity in the differential voltage-dependent gain of the circuit arrangement. One reason lies in a temperature dependence of the base currents of transistors in integrated circuits.

SUMMARY

The circuit arrangement according to the present invention has the advantage that even when transistors in integrated circuits are used, a precise differential voltage analysis can be accomplished with a relatively low current gain. It is particularly advantageous that circuit arrangements can be achieved in very confined spaces with a substantially temperature-independent characteristic curve by way of components, in particular transistors, that can be manufactured in large quantities and relatively economically using bipolar processes. The fact that a compensation circuit whose temperature behavior corresponds to the temperature behavior of cross resistances of the circuit arrangement is associated with each of the inputs of the circuit arrangement makes it advantageously possible to compensate for the nonlinearities which usually occur in the integrated-technology circuit arrangement.

In an example embodiment of the present invention, provision is made for each compensation circuit to comprise a compensation resistor, the compensation resistor having approximately three times the value of a cross resistor of the circuit arrangement. This compensates in particularly simple fashion, i.e., by way of one additional compensation resistor in each case, for a nonlinear temperature behavior of the circuit arrangement. The compensation resistors can easily be integrated into the patterning process of integrated circuits. The compensation circuit also may include a transistor whose base is connected to the signal source furnishing the voltages to be compared, and whose emitter is connected to the compensation resistor. The advantageous result is that because of the emitter connection of the transistor of the compensation circuit, an internal resistance of the signal source is negligible, and thus exerts no influence on the gain characteristics of the circuit arrangement.

Provision is also made, in an example embodiment of the present invention, for the compensation resistors to be circuit components of a resistance bridge which, as the signal source, furnishes the voltage signals to the inputs of the circuit arrangement. As a result, the temperature dependence of the circuit arrangement can already be taken into account by appropriate selection of the resistances of the signal source, so that it is thus possible to achieve, without additional outlay, a complete circuit arrangement which contains the signal source as well as the differential voltage amplifier circuit arrangement, and has a temperature-independent characteristic curve.

DETAILED DESCRIPTION

Figure 1:
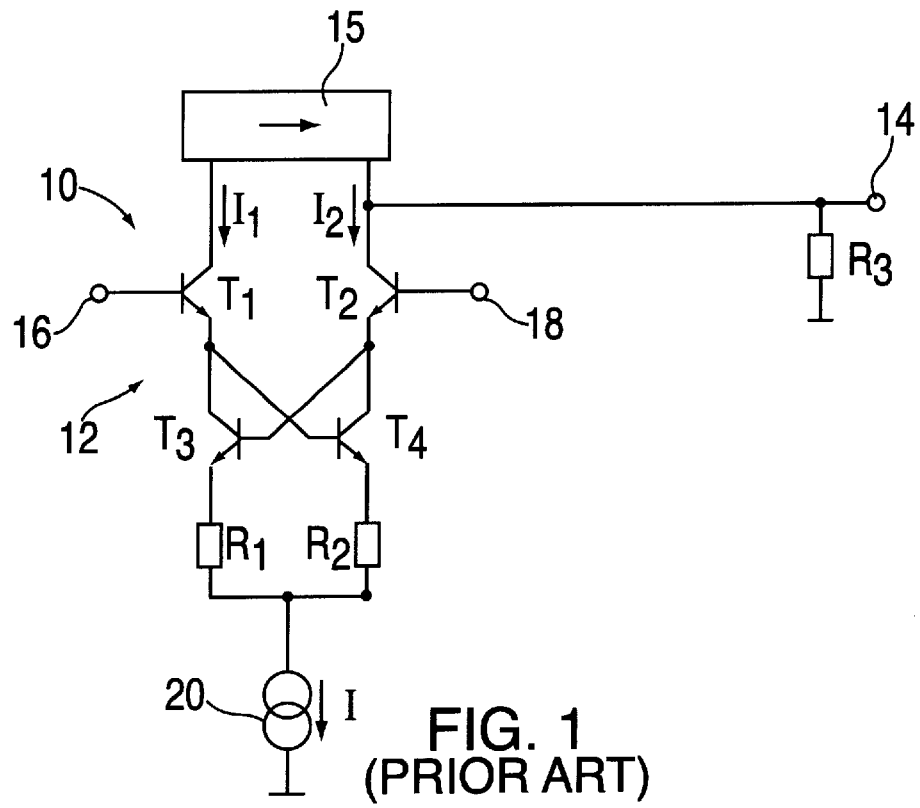
FIG. 1 shows a circuit arrangement for amplifying a differential voltage signal.

FIG. 1 shows a circuit arrangement 10 for amplifying a differential voltage signal. Circuit arrangement 10 comprises a cross-coupled circuit 12 of transistors $T_1$, $T_2$, $T_3$, and $T_4$. The emitter of transistor $T_1$ is connected to the collector of transistor $T_3$ and the base of transistor $T_4$. The emitter of transistor $T_2$ is connected to the collector of transistor $T_4$ and the base of transistor $T_3$. The collector of transistor $T_2$ is connected to an output 14, and the collector of transistor $T_1$, via a current mirror 15, also to the output of circuit arrangement 10. The base of transistor $T_1$ is connected to a first input 16, and the base of transistor $T_2$ to a second input 18 of circuit arrangement 10. The emitter of transistor $T_3$ is connected via a resistor $R_1$ to a current source 20. The emitter of transistor $T_4$ is connected via a resistor $R_2$ to current source 20. Current source 20 is connected to a reference potential. Associated with output 14 is a resistor $R_3$ constituting a resistive load, which is connected on the one hand to the collector of transistors $T_1$ and $T_2$ and on the other hand to the reference potential.

Circuit arrangement 10 functions as follows:

When common-mode voltage signals are applied to inputs 16 and 18, a total current I resulting from cross current $I_1$ and $I_2$ flows as a consequence of a resulting voltage difference between the voltage signals present at inputs 16 and 18. This total current I is converted, by way of resistor $R_3$ at output 14, into an analyzable output voltage signal. This output signal is proportional to a difference between the voltage signals present at inputs 16 and 18. The configuration and function of circuit arrangement 10 shown in FIG. 1 are commonly known. If this circuit arrangement 10 is manufactured as an integrated circuit using bipolar technology, transistors $T_1$, $T_2$, $T_3$, and $T_4$ have a low current gain, which results in a temperature-dependent nonlinearity in the gain.

A transfer function of circuit arrangement 10 can be written as follows:

$$U_{14} = (U_{18} - U_{16}) \times \frac{R_3}{R+f},$$

where $U_{14}$ is the voltage at output 14, $U_{18}$ the voltage at input 18, $U_{16}$ the voltage at input 16, R the cross resistance of circuit arrangement 10 ($R=R_1=R_2$), and f the error function of circuit arrangement 10 due to a finite current gain.

Error function f can be described as follows:

$$f = \frac{(3\beta+1)R}{(\beta-1)\beta} + \frac{(I_1+I_2)U_T}{\beta I_1 \times I_2 - I_1^2}$$

where beta is the current gain factor of the transistors used in circuit arrangement 10, $U_T$ a temperature voltage where $$U_T = \frac{k \cdot T}{q}$$

(k=Boltzmann constant, T=absolute temperature, q=elementary charge), and $I_1$, $I_2$ are cross currents of circuit arrangement 10.

An ideal gain function of circuit arrangement 10 is achieved when error function f equals zero.

An explanation will be given below, with reference to FIGS. 2 through 4, of the addition to circuit arrangement 10 of compensation circuits 22 associated with inputs 16 and 18, parts identical to those in FIG. 1 being respectively given identical reference characters and not explained again.

Figure 2:
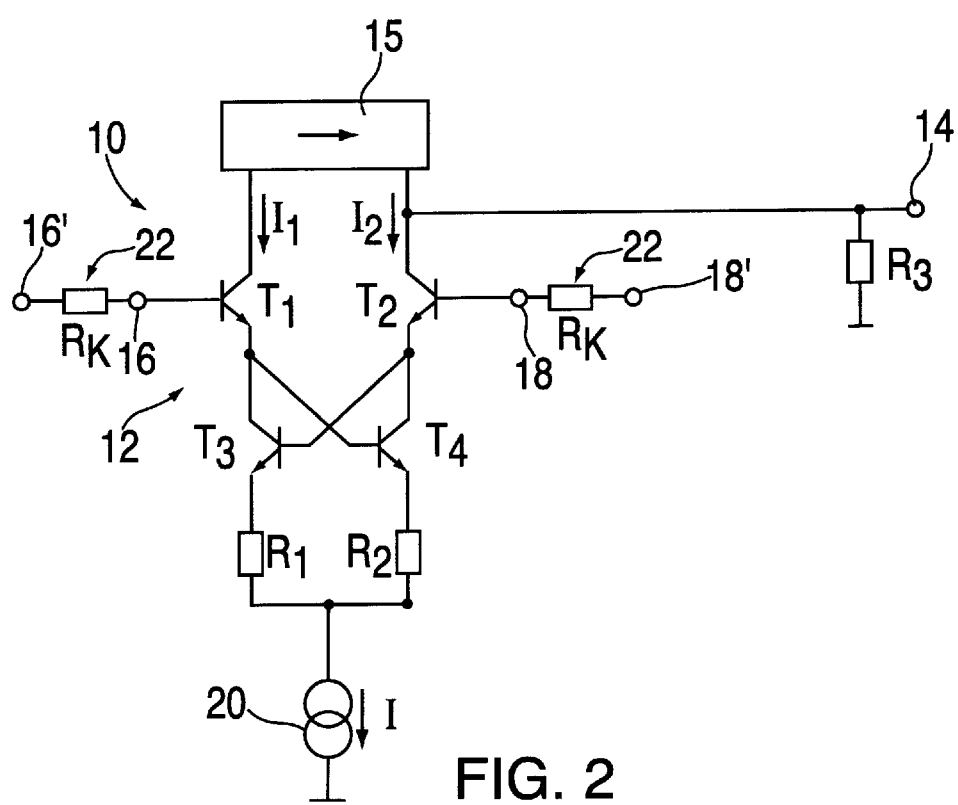
FIG. 2 shows an example embodiment of the compensation circuit according to the present invention.

As shown in FIG. 2, compensation circuit 22 includes in each case a compensation resistor $R_K$. This is connected in series with inputs 16 and 18, respectively, resulting in inputs 16' and 18', respectively, of circuit arrangement 10.

The insertion of compensation circuit 22, in this case compensation resistors $R_K$, modifies error function f of circuit arrangement 10 as follows:

$$f = \frac{(3\beta+1)R}{(\beta-1)\beta} + \frac{(I_1+I_2)U_T}{\beta I_1 \times I_2 - I_1^2} - \frac{R_k}{\beta}$$

If the value of compensation resistors $R_K$ is then selected so that it corresponds approximately to three times the value of resistance R and thus of resistor $R_1$ and resistor $R_2$, it is apparent from the equation that error function f becomes approximately zero, so that circuit arrangement 10 possesses an approximately ideal gain function.

In order to ensure temperature-dependent linearity of the gain function of circuit arrangement 10, the temperature behavior of resistors $R_K$ corresponds to the temperature behavior of resistance R ($R=R_1=R_2$).

Compensation resistors $R_K$ can easily be incorporated into an integrated circuit. In particular if a signal source furnishing (?the voltage) at inputs 16 and 18 is of low resistance, it is possible with the circuit variant shown in FIG. 2 to compensate easily for temperature-related nonlinearities.

Figure 3:
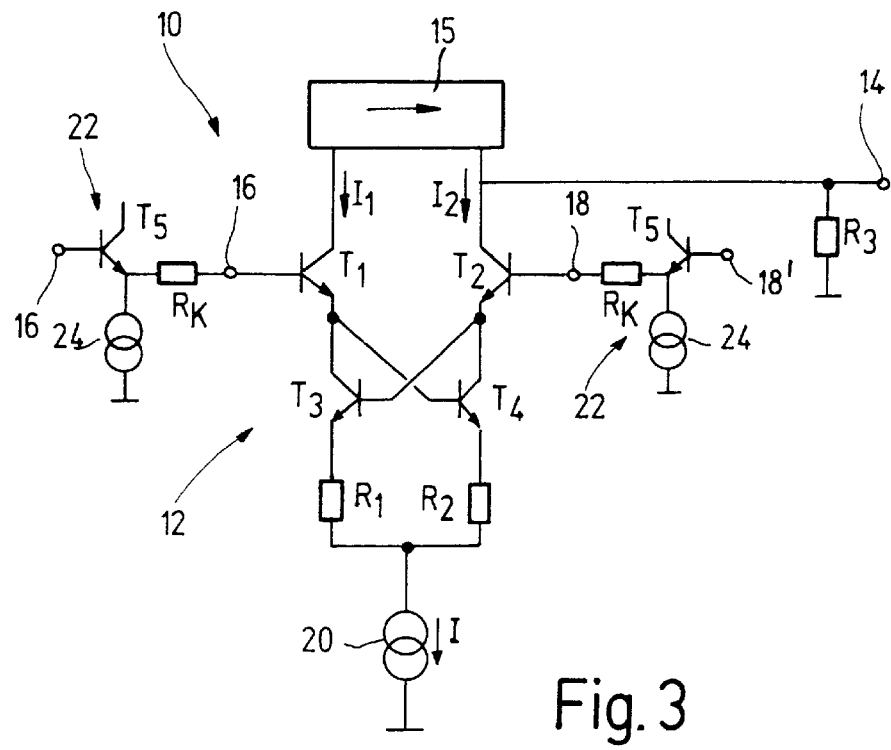
FIG. 3 shows yet another example embodiment of the compensation circuit according to the present invention.

FIG. 3 shows a further circuit variant, compensation circuit 22 comprising in each case a transistor $T_5$ and compensation resistor $R_K$. The base of transistor $T_5$ is connected to outputs 16' and 18' respectively, of circuit arrangement 10, while the emitter is connected to resistor $R_K$. The emitter of transistor $T_5$ is moreover connected via a current source 24 to a reference potential. The collector of transistor $T_5$ is connected to a potential which requires no further consideration. The result of inserting transistor $T_5$ into compensation circuit 22 with an emitter connection is that an internal resistance of the signal source furnishing the voltage signals present at inputs 16' and 18', respectively, is negligible. It is thereby possible, once again using an integrated circuit, to compensate for a temperature-related nonlinearity of circuit arrangement 10. Influences of the signal source can be compensated for by inserting only one emitter-connected transistor.

Figure 4:
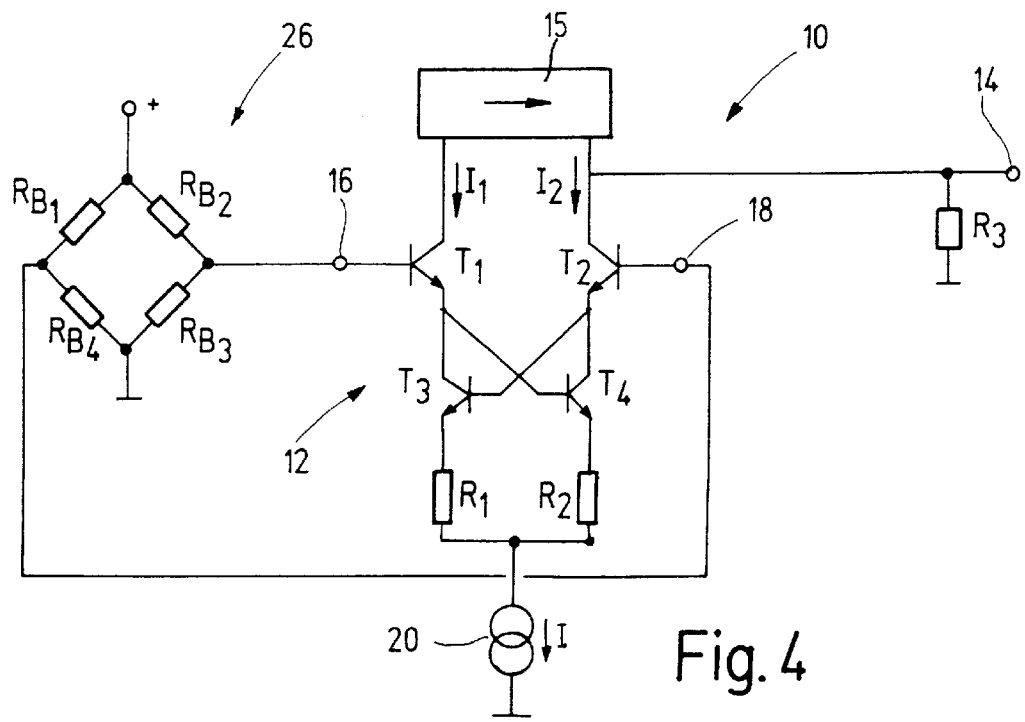
FIG. 4 shows still another example embodiment of the compensation circuit according to the present invention.

A further circuit variant is shown in FIG. 4. Here a signal source 26 which furnishes the input signals to circuit arrangement 10 is incorporated into the system for compensating for the temperature-related nonlinearity of circuit arrangement 10. Signal source 26 is, for example, a bridge circuit (Wheatstone bridge) made up of resistors $R_{B1}$, $R_{B2}$, $R_{B3}$, and $R_{B4}$, whose equilibrium changes as a function of physical variables acting on individual resistors $R_{B1}$, $R_{B2}$, $R_{B3}$, and $R_{B4}$, so that a voltage difference can occur at inputs 16 and 18. Compensation resistance $R_K$ can be defined by dimensioning the resistances of the resistance bridge of signal source 26. Dimensioning of the resistances of the resistance bridge is accomplished, in this context, using the following equation:

$$\frac{R_{B_2} \cdot R_{B_3}}{R_{B_2} + R_{B_3}} = R_K = \frac{R_{B_1} \cdot R_{B_4}}{R_{B_1} + R_{B_4}}$$

What is claimed is:

1. A circuit arrangement for amplifying a differential voltage signal in an output signal proportional to a voltage difference, comprising:

two inputs, voltages of a signal source provided at the two inputs;

an output providing a current signal proportional to a voltage difference at the two inputs;

cross-coupled transistors, each of the inputs being connected to a base of a respective one of the cross-coupled transistors; and a respective compensation circuit associated with each of the inputs, each respective compensation circuit having a thermal characteristic corresponding to a thermal characteristic of a cross resistance of the circuit arrangement.

2. The circuit arrangement according to claim 1, wherein each respective compensation circuit includes a respective compensation resistance, each respective compensation resistance having approximately three times a value of the cross resistance of the circuit arrangement.

3. The circuit arrangement according to claim 2, wherein each respective compensation circuit includes a respective transistor, a base of each respective transistor being coupled to the signal source, an emitter of each respective transistor being coupled to the respective compensation resistance of the respective compensation circuit.

4. The circuit arrangement according to claim 2, wherein each respective compensation resistance includes circuit components of a resistance bridge which provides the voltage signals to the inputs.

5. The circuit arrangement according to claim 4, wherein resistances of the resistance bridge are dimensioned according to the following equation:

$$\frac{R_{B_2} \cdot R_{B_3}}{R_{B_2} + R_{B_3}} = R_K = \frac{R_{B_1} \cdot R_{B_4}}{R_{B_1} + R_{B_4}}$$

where $R_{B1}$, $R_{B2}$, $R_{B3}$ and $R_{B4}$ are the resistances of the resistance bridge and $R_K$ is the compensation resistance.

* * * * *